United States Patent
Calafato et al.

(10) Patent No.: US 6,198,672 B1
(45) Date of Patent: Mar. 6, 2001

(54) VOLTAGE PHASE GENERATOR WITH INCREASED DRIVING CAPACITY

(75) Inventors: Carmela Calafato, Milazzo; Maurizio Gaibotti, Cesano Maderno, both of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/257,684

(22) Filed: Feb. 26, 1999

(30) Foreign Application Priority Data

Feb. 27, 1998 (IT) ............................................... TO98A0167

(51) Int. Cl.$^7$ ...................................................... G11C 7/00
(52) U.S. Cl. ................................ 365/189.11; 365/189.08; 365/226
(58) Field of Search ............................. 365/189.11, 226, 365/189.09, 189.08; 331/46; 307/109; 330/253

(56) References Cited

U.S. PATENT DOCUMENTS

| | | | |
|---|---|---|---|
| 5,097,226 | * | 3/1992 | Pascucci et al. ........................ 331/46 |
| 5,278,786 | * | 1/1994 | Kawauchi et al. .................... 365/185 |
| 5,315,167 | * | 5/1994 | Chan et al. ........................ 307/296.6 |
| 5,334,948 | * | 8/1994 | Fong et al. ............................. 330/253 |
| 5,726,944 | * | 3/1998 | Pelley, III et al. .................... 365/226 |
| 5,821,639 | * | 10/1998 | Tailliet ................................. 307/109 |

* cited by examiner

*Primary Examiner*—David Nelms
*Assistant Examiner*—Thong Le
(74) *Attorney, Agent, or Firm*—Theodore E. Galanthay; Stephen C. Bongini; Fleit, Kain, Gibbon, Gutman & Bongini P.L

(57) ABSTRACT

A voltage phase generator that generates a normal voltage phase, a negated normal voltage phase, a boosted voltage phase, and a negated boosted voltage phase. The voltage phase generator includes a first driver circuit that supplies the normal voltage phase to a first output node, and a second driver circuit that supplies the negated normal voltage phase to a second output node. The first and second driver circuits are driven by additional voltage phases that have a boosted voltage. In one preferred embodiment, each of the driver circuits includes a pull-up connected between a supply voltage and one of the output nodes, and a pull-down connected between ground and the one output node. Additionally, the present invention provides a voltage boosting circuit that includes a booster circuit and a voltage phase generator. The booster circuit receives four voltage phases and generates a boosted voltage, and the voltage phase generator generates the four voltage phases and additional voltage phases that have a boosted voltage. The additional voltage phases drive driver circuits that supply the normal voltage phase and the negated normal voltage phase to the booster circuit. In a preferred embodiment, the voltage boosting circuit is integrated in a low supply voltage circuit device.

20 Claims, 5 Drawing Sheets

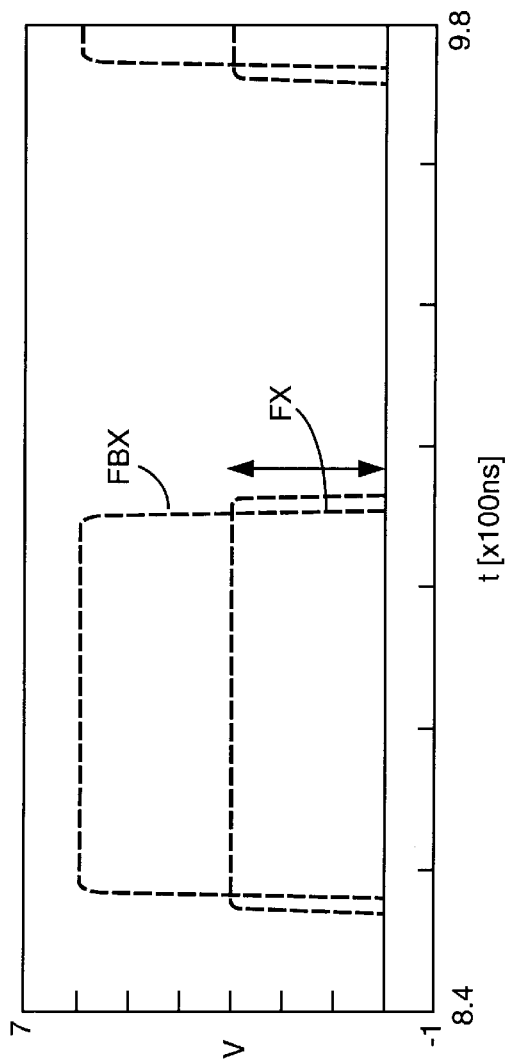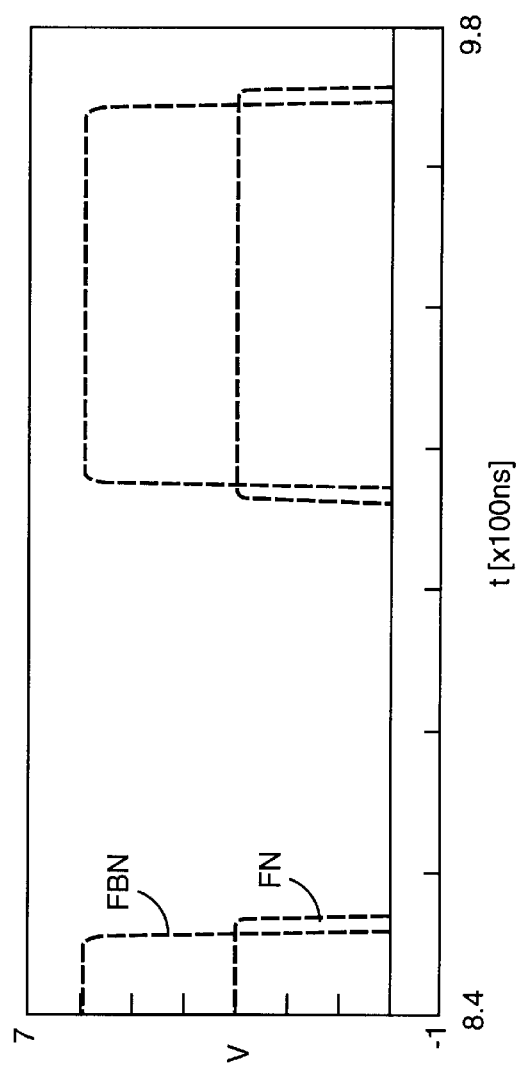
PRIOR ART
FIG. 2a
PRIOR ART
FIG. 2b

VOLTAGE PHASE GENERATOR WITH INCREASED DRIVING CAPACITY

CROSS-REFERENCE RO RELATED APPLICATIONS

This application is based upon and claims priority from prior Italian Patent Application No. TO-98-A000167, filed Feb. 27, 1998, the entire disclosure of which is herein incorporated by reference.

Additionally, this application is related to the applications "LOW CONSUMPTION BOOSTED VOLTAGE DRIVING CIRCUIT" and "VOLTAGE BOOSTING CIRCUIT FOR GENERATING BOOSTED VOLTAGE PHASES", which were filed on the same day as the present application and commonly assigned herewith to STMicroelectronics S.r.l. These related applications are herein incorporated by reference.

BACKGROUND OF THE INVENTION

1. Field of the Invention

The present invention relates to semiconductor memory devices, and more specifically to a voltage phase generator for driving booster circuits of a memory device.

2. Description of Related Art

Integrated circuits, and especially memory circuits, use booster circuits to raise the voltage over the supply voltage for applications such as the driving of memory arrays word lines. Such booster circuits operate by capacitively charging internal nodes with multiple voltage signals that have a determined time sequence. The voltage signals have the same amplitude but a different phase shift, so they are commonly defined as voltage phases. The voltage phases are generated by appropriate voltage phase generators. For such a purpose, a voltage phase generator typically generates four voltage phases: two phases with an amplitude equal to the supply voltage, and two phases with a greater amplitude that is obtained through a voltage boosting circuit or "bootstrap". Usually, such a greater amplitude amounts to nearly twice the amplitude of the supply voltage. The voltage phases with a raised voltage are known as "boosted" voltage phases.

FIG. 1a shows a conventional voltage phase generator 4. A temporary memory circuit or bi-stable latch LTH is controlled by control signals ST1 and ST2 to pace a normal voltage phase FX (i.e., a signal having the amplitude of the supply voltage VDD) and a negated normal voltage phase FN (i.e., in phase opposition to the normal voltage phase FX). The voltage boosting circuits or bootstraps BT produce a boosted voltage phase FBX (i.e., having a greater amplitude than the supply voltage VDD) and a negated boosted voltage phase FBN from the normal voltage phase FX and negated normal voltage phase FN.

The advancement of the normal voltage phase FX and negated normal voltage phase FN towards the voltage boosting circuits BT is paced by a clock signal CK and a negated clock signal CKN, which are the main clocks of the integrated circuit. The four voltage phases described above are shown in FIGS. 2a and 2b. The voltage phase generator 4 drives a booster circuit 1, which is shown in greater detail in FIG. 1b. The booster circuit 1 has two stages S1 and S2 that receive a supply voltage signal at an input IN and supply a boosted voltage signal from an output OUT. The booster circuit 1 may contain several stages that subsequently raise the voltage up to the desired value. The booster circuit 1 is substantially driven by the four voltage phases FX, FN, FBX, and FBN generated by the voltage phase generator 4 of FIG. 1a.

Both of the normal voltage phases FX and FN are generally subject to high current demands during charge transfers from one stage to the next in the booster circuit 1. In contrast, the boosted voltage phases are primarily used to avoid threshold effects of transfer transistors M1 and M2, which are responsible for charge transfer from one stage to the next. Conventionally, high currents are achieved by interposing driving stages 5 having high driving capacity on the normal voltage phases FX and FN that exit the voltage phase generator 4. In other words, the circuit has driving stages 5 capable of supplying high current and formed by adequately-sized inverter circuits (i.e., with a high channel width to length or aspect ratio) that are capable of supplying the high current.

However, such aspect ratios tend to increase the peak current consumed by the inverter circuit during switching. Besides increasing consumption of the inverter circuit, this can also generate unwanted supply noise. Therefore, there is a drawback to using such inverter circuits in the inability to independently increase the aspect ratio of the transistors of the inverters to comply with any driving capacity requirements because the current consumed during switching also increases.

SUMMARY OF THE INVENTION

In view of these drawbacks, it is an object of the present invention to overcome the above-mentioned drawbacks and to provide a voltage phase generator that has a more efficient and improved performance.

Another object of the present invention is to provide a voltage phase generator that can supply normal voltages with a high driving capacity without using a large-sized inverter circuit.

One embodiment of the present invention provides a voltage phase generator that generates a normal voltage phase, a negated normal voltage phase, a boosted voltage phase, and a negated boosted voltage phase. The voltage phase generator includes a first driver circuit that supplies the normal voltage phase to a first output node, and a second driver circuit that supplies the negated normal voltage phase to a second output node. The first and second driver circuits are driven by additional voltage phases that have a boosted voltage. In one preferred embodiment, each of the driver circuits includes a pull-up connected between a supply voltage and one of the output nodes, and a pull-down connected between ground and the one output node.

Another embodiment of the present invention provides a voltage boosting circuit that includes a booster circuit and a voltage phase generator. The booster circuit receives four voltage phases and generates a boosted voltage, and the voltage phase generator generates the four voltage phases and additional voltage phases that have a boosted voltage. The additional voltage phases drive driver circuits that supply the normal voltage phase and the negated normal voltage phase to the booster circuit. In a preferred embodiment, the voltage boosting circuit is integrated in a low supply voltage circuit device.

Other objects, features, and advantages of the present invention will become apparent from the following detailed description. It should be understood, however that the detailed description and specific examples, while indicating preferred embodiments of the present invention, are given by way of illustration only and various modifications may naturally be performed without deviating from the present invention.

BRIEF DESCRIPTION OF THE DRAWINGS

FIG. 1b shows a detailed view of the booster circuit of FIG. 1a;

FIGS. 2a and 2b show timing diagrams of the voltage phases generated by the voltage phase generator of FIG. 1 a;

DETAILED DESCRIPTION OF PREFERRED EMBODIMENTS

Preferred embodiments of the present invention will be described in detail hereinbelow with reference to the attached drawings.

Figure 3:
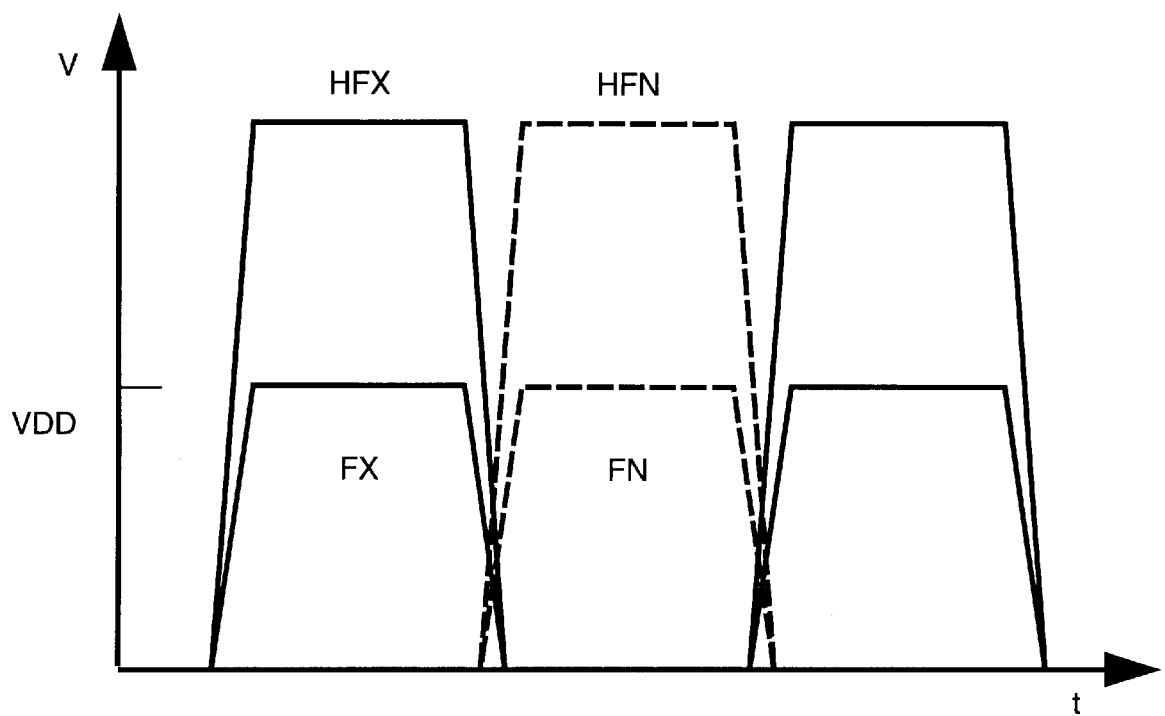
FIG. 3 shows a timing diagram of additional voltage phases that are used in voltage phase generators according to preferred embodiments of the present invention.

In order to increase the driving capacity of the normal voltage phases FX and FN without using excessively-sized driver circuits, preferred embodiments of the present invention use two additional voltage phases HFX and HFN that are generated as shown in FIG. 3. The additional voltage phase HFX corresponds to normal voltage phase FX, and the other additional voltage phase HFN, which is in phase opposition, corresponds to the normal voltage phase FN. The additional voltage phases HFX and HFN substantially match boosted voltage phases FBX and FBN in their voltage amplitude.

Figure 1A:
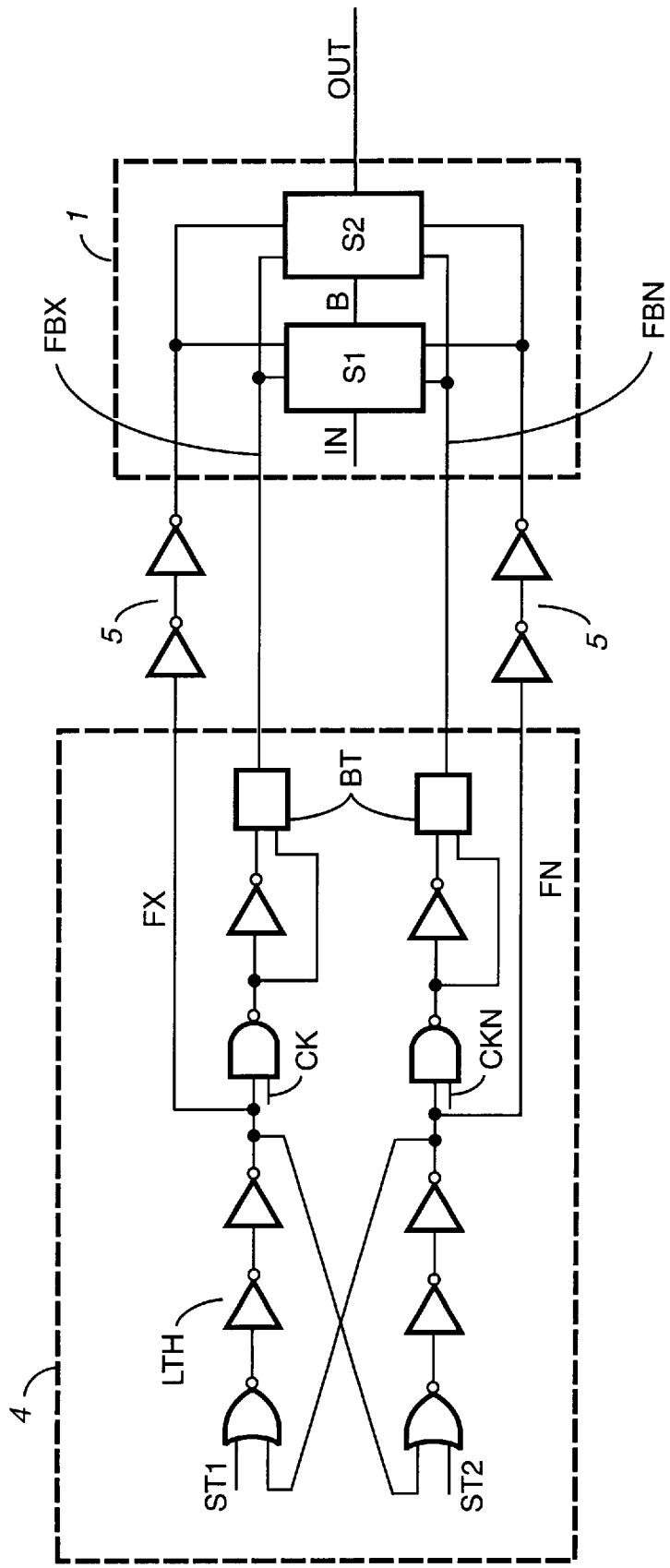
FIG. 1a shows a schematic diagram of a conventional voltage phase generator connected to a conventional booster circuit.
Figure 1B:
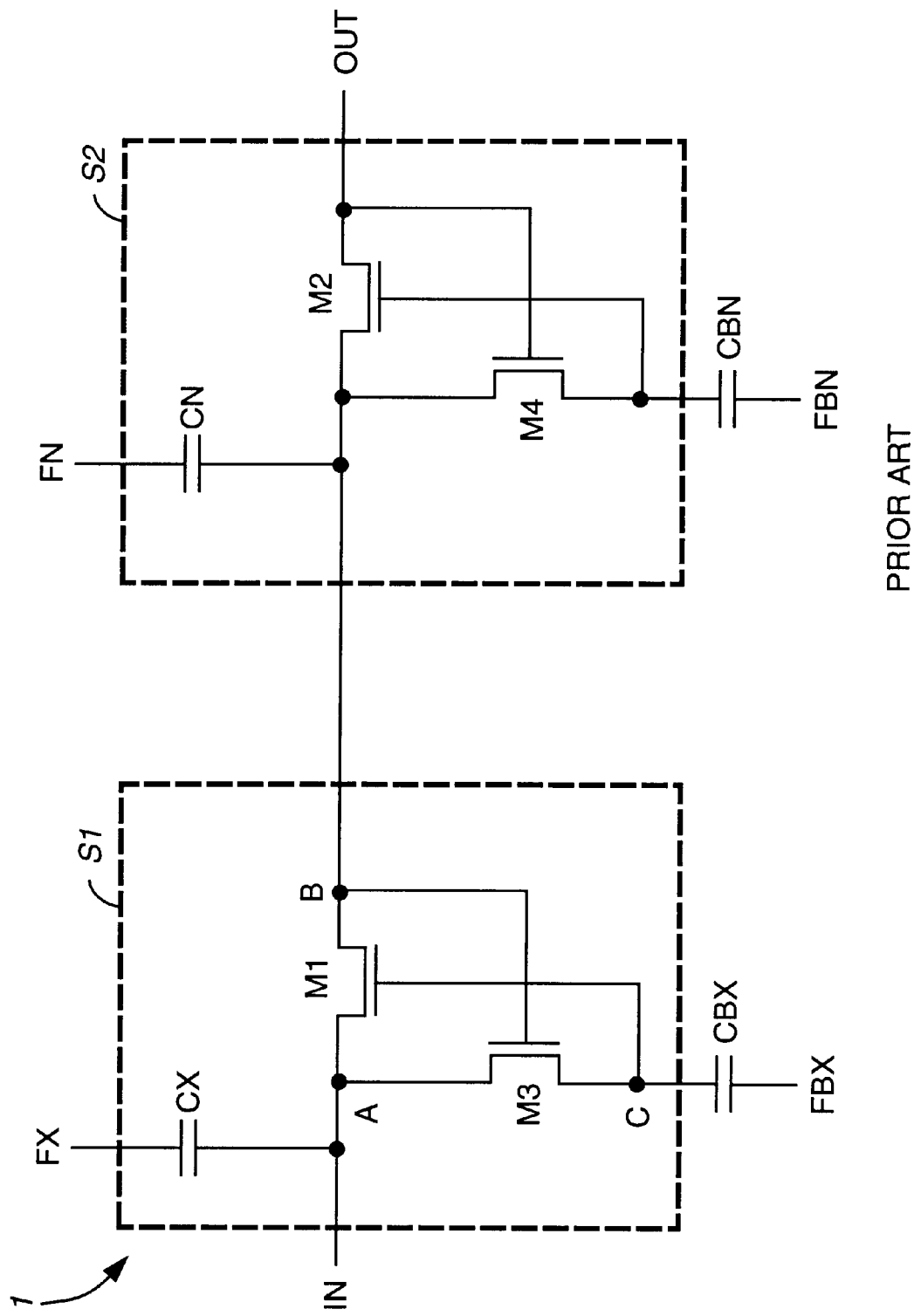
Figure 4:
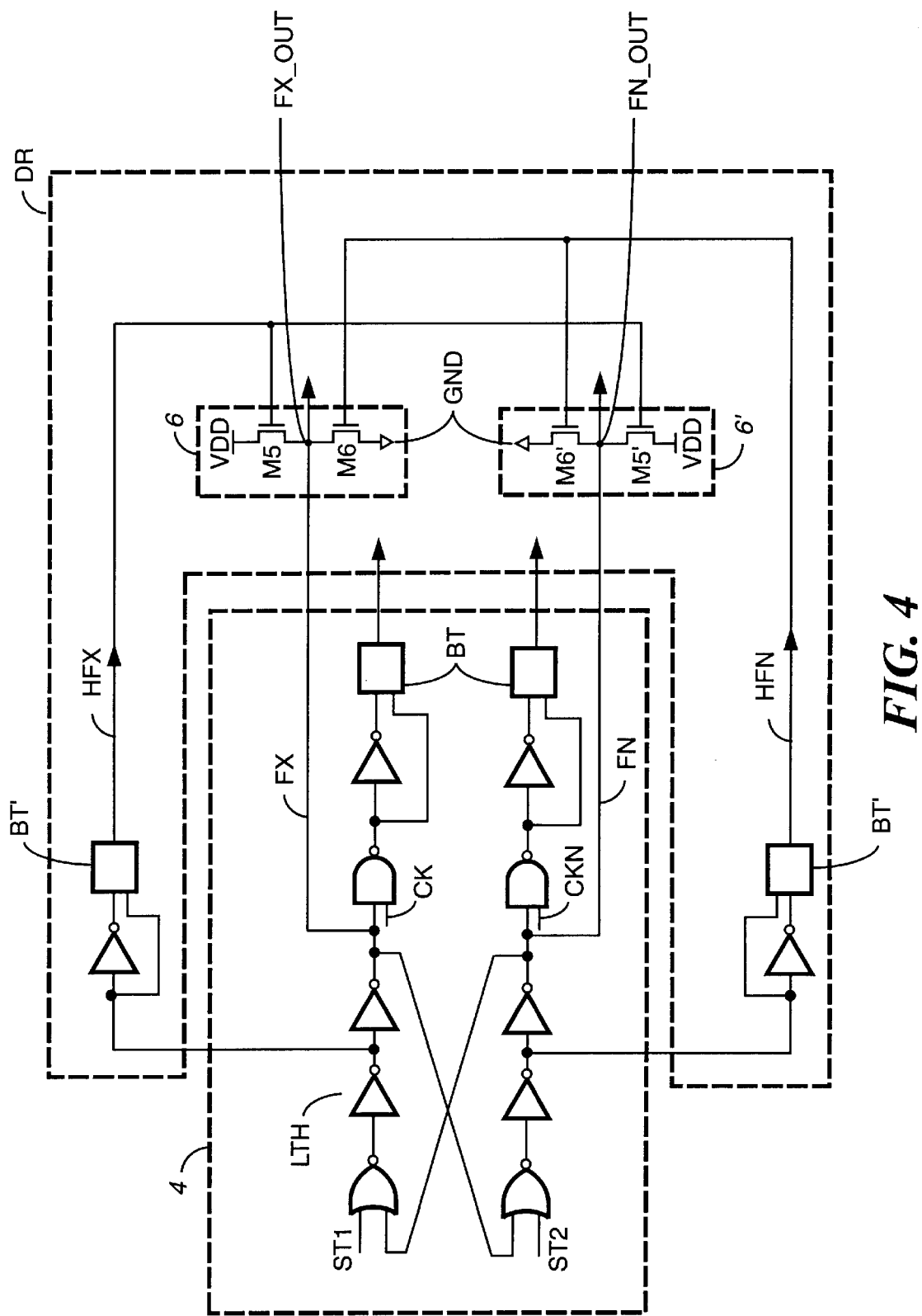
FIG. 4 shows a voltage phase generator according to a preferred embodiment of the present invention.

FIG. 4 shows a voltage phase generator connected with a driver circuit DR according to a preferred embodiment of the present invention. Because the circuit is symmetric reference will only be made to the normal voltage phase FX, but the following description also applies to the negated normal voltage phase FN. The additional voltage phase HFX is produced by the bistable latch LTH through a voltage boost by a voltage boosting circuit BT' that is substantially similar to the voltage boosting circuit BT of FIG. 1a. A driver stage 6 has an N-channel MOS transistor M5 whose aspect ratio provides a high driving capacity.

Transistor M5 is connected with its drain to the supply voltage VDD and its source to an output node FX_OUT, which is also connected to the drain of another transistor M6 that is similar to transistor M5. Further, the output node FX_OUT receives the normal voltage phase FX. Transistor M5 receives at its gate the additional voltage phase HFX as a control signal, and transistor M6 receives at its gate the other additional voltage phase HFN as a control signal. A driver circuit 6' that is the dual of driver circuit 6 is provided for driving the negated normal voltage phase FN through transistors M5' and M6'.

Thus, transistor M5 allows the additional voltage phase HFX to lead the output node FX_OUT to the supply voltage value VDD. Because the additional voltage phase HFX has a higher value than the supply voltage VDD, transistor M5 with a high driving capacity (i.e., sized for supplying a high current) can be efficiently controlled. Advantageously, there only needs to be supplied a conveniently high gate voltage (i.e., the additional voltage phase HFX) to transistor M5 to produce the desired driving current.

Thus, when transistor M5 is brought into conduction by the additional voltage phase HFX, it performs a simple pull-up action at the output FX_OUT and at the same time supplies a high current, without having to face the problems related to current consumption in the switching operation that are introduced by inverter circuits 5. When transistor M5 drives the output FX_OUT with a normal voltage phase FX with high driving capacity, transistor M6' of driver circuit 6' maintains the other output node FN_OUT at ground, and thus performs a pull-down on the output node FN_OUT.

Accordingly, the driver circuit of the present invention solves the driving problem for both normal voltage phases FX and FN without requiring excessively-sized inverter circuits as drivers. This avoids an excessive current peak during switching, which may lead to dangerous supply noise, especially when using low supply voltages. Further, the driver circuit of the present invention advantageously uses a driving stage having only one N-channel transistor that has a high voltage applied to its gate electrode to supply a high driving current to the extent allowed by its aspect ratio without having to take any further phenomena into account.

The voltage phase generator of the present invention is specially suited for use in integrated circuits, especially in non-volatile memory devices such as EPROM or EEPROM memories. The voltage phase generator of the present invention is also specially suited for use in a low supply voltage memory device.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, other embodiments of the present invention may not include all of the features described above. Therefore, it is intended that the present invention not be limited to the particular embodiments disclosed, but that the invention include all embodiments falling within the scope of the appended claims.

What is claimed is:

1. A voltage phase generator for generating at least a normal voltage phase, a negated normal voltage phase, a boosted voltage phase, and a negated boosted voltage phase, said voltage phase generator comprising:

a first driver circuit supplying the normal voltage phase to a first output node; and a second driver circuit supplying the negated normal voltage phase to a second output node, wherein the first and second driver circuits are driven by additional voltage phases that have a boosted voltage, the additional voltage phases being different than the boosted voltage phase and the negated boosted voltage phase that are generated by the voltage phase generator.

2. The voltage phase generator as defined in claim 1, wherein the additional voltage phases are derived from the voltage phase generator through voltage boosting circuits.

3. The voltage phase generator as defined in claim 1, wherein each of the driver circuits includes a pull-up connected between a supply voltage and one of the output nodes.

4. The voltage phase generator as defined in claim 3, wherein the pull-up is formed by a MOS transistors that has its drain connected to the supply voltage, its source connected to one of the output nodes, and its gate connected to one of the additional voltage phases.

5. The voltage phase generator as defined in claim 3, wherein each of the driver circuits further includes a pull-down connected between ground and the one of the output nodes.

6. The voltage phase generator as defined in claim 5, wherein the pull-down is formed by a MOS transistor that has its source connected to ground, its drain connected to one of the output nodes, and its gate connected to one of the additional voltage phases.

7. The voltage phase generator as defined in claim 6, wherein the pull-up is formed by a MOS transistors that has its drain connected to the supply voltage, its source connected to the one output node, and its gate connected to the other of the additional voltage phases.

8. A voltage boosting circuit of the type that uses four voltage phases including a normal voltage phase, a negated normal voltage phase, a boosted voltage phase, and a negated boosted voltage phase, said voltage boosting circuit comprising:

a booster circuit receiving the four voltage phases and generating a boosted voltage; and a voltage phase generator generating the four voltage phases and additional voltage phases that have a boosted voltage, the additional voltage phases being different than the boosted voltage phase and the negated boosted voltage phase, wherein the additional voltage phases drive driver circuits that supply the normal voltage phase and the negated normal voltage phase to the booster circuit.

9. The voltage boosting circuit as defined in claim 8, wherein each of the driver circuits of the voltage phase generator includes a pull-up connected between a supply voltage and one output node.

10. The voltage boosting circuit as defined in claim 9, wherein the pull-up is formed by a MOS transistors that has its drain connected to the supply voltage, its source connected to one of the output nodes, and its gate connected to one of the additional voltage phases.

11. The voltage boosting circuit as defined in claim 9, wherein each of the driver circuits of the voltage phase generator further includes a pull-down connected between ground and the one of the output nodes.

12. The voltage boosting circuit as defined in claim 11, wherein the pull-down is formed by a MOS transistor that has its source connected to ground, its drain connected to one of the output nodes, and its gate connected to one of the additional voltage phases.

13. The voltage boosting circuit as defined in claim 12, wherein the pull-up is formed by a MOS transistors that has its drain connected to the supply voltage, its source connected to the one output node, and its gate connected to the other of the additional voltage phases.

14. The voltage boosting circuit as defined in claim 8, wherein the voltage phase generator further includes:

a temporary memory circuit; and voltage boosting circuits receiving the normal voltage phase and the negated normal voltage phase from the temporary memory circuit and generating the additional voltage phases.

15. The voltage boosting circuit as defined in claim 8, wherein the voltage boosting circuit is integrated in a low supply voltage circuit device.

16. A memory device comprising:

a memory array having memory cells arranged in rows and columns;

word lines connected to the memory cells;

bit lines connected to the memory cells; and a voltage boosting circuit using four voltage phases including a normal voltage phase, a negated normal voltage phase, a boosted voltage phase, and a negated boosted voltage phase to generate a boosted voltage, wherein the voltage boosting circuit includes:

a booster circuit receiving the four voltage phases and generating the boosted voltage; and a voltage phase generator generating the four voltage phases and additional voltage phases that have a boosted voltage, the additional voltage phases being different than the boosted voltage phase and the negated boosted voltage phase, wherein the additional voltage phases drive driver circuits that supply the normal voltage phase and the negated normal voltage phase to the booster circuit.

17. The memory device as defined in claim 16, wherein each of the driver circuits of the voltage phase generator includes a pull-up connected between a supply voltage and one output node.

18. The memory device as defined in claim 17, wherein each of the driver circuits of the voltage phase generator further includes a pull-down connected between ground and the one of the output nodes.

19. The memory device as defined in claim 16, wherein the voltage phase generator further includes:

a temporary memory circuit; and voltage boosting circuits receiving the normal voltage phase and the negated normal voltage phase from the temporary memory circuit and generating the additional voltage phases.

20. The memory device as defined in claim 16, wherein the memory device is a low supply voltage memory device.

* * * * *

UNITED STATES PATENT AND TRADEMARK OFFICE
CERTIFICATE OF CORRECTION

PATENT NO. : 6,198,672 B1
DATED : March 6, 2001
INVENTOR(S) : Carmela Calafato, et al.

It is certified that error appears in the above-identified patent and that said Letters Patent is hereby corrected as shown below:

Under Foreign Application Priority Data, please change "T098A0167" to -- T098A000167 --

Under Attorney, Agent for Firm, please change "Gibbon" to -- Gibbons --

Signed and Sealed this

Eighteenth Day of September, 2001

*Attest:*

Nicholas P. Godici

*Attesting Officer*

NICHOLAS P. GODICI
*Acting Director of the United States Patent and Trademark Office*